(12) United States Patent
Powell et al.

(10) Patent No.: US 7,095,088 B2
(45) Date of Patent: Aug. 22, 2006

(54) SYSTEM AND DEVICE INCLUDING A BARRIER LAYER

(75) Inventors: Don Carl Powell, Boise, ID (US); Garry Anthony Mercaldi, Meridian, ID (US); Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/859,814

(22) Filed: Jun. 3, 2004

(65) Prior Publication Data

US 2004/0217476 A1  Nov. 4, 2004

Related U.S. Application Data

(62) Division of application No. 10/039,517, filed on Jan. 3, 2002, now Pat. No. 6,774,443, which is a division of application No. 09/653,639, filed on Aug. 31, 2000, now Pat. No. 6,410,968.

(51) Int. Cl.
*H01L 29/76* (2006.01)

(52) U.S. Cl. ..................... 257/412; 257/413

(58) Field of Classification Search ........ 257/412–413, 257/287, 751–757, 763; 438/652–653, 428, 438/665
See application file for complete search history.

(56) References Cited

U.S. PATENT DOCUMENTS

| | | | |
|---|---|---|---|
| 4,937,129 A * | 6/1990 | Yamazaki ............... 428/195.1 |
| 5,290,736 A | 3/1994 | Sato et al. | |
| 5,304,398 A | 4/1994 | Krusell et al. | |
| 5,312,776 A | 5/1994 | Murakami et al. | |
| 5,358,739 A | 10/1994 | Baney et al. | |
| 5,525,551 A | 6/1996 | Ohta | |
| 5,633,036 A * | 5/1997 | Seebauer et al. ............ 427/126 |
| 5,696,917 A | 12/1997 | Mills et al. | |
| 5,814,852 A | 9/1998 | Sandhu et al. | |
| 5,844,771 A | 12/1998 | Graettinger et al. | |
| 5,872,696 A | 2/1999 | Peters et al. | |
| 5,874,766 A | 2/1999 | Hori | |
| 5,882,978 A | 3/1999 | Srinivasan et al. | |
| 5,962,904 A | 10/1999 | Hu | |
| 6,096,640 A | 8/2000 | Hu | |
| 6,140,187 A * | 10/2000 | DeBusk et al. ............. 438/287 |
| 6,197,628 B1 | 3/2001 | Vaartstra et al. | |
| 6,218,260 B1 | 4/2001 | Lee et al. | |
| 6,291,288 B1 | 9/2001 | Huang et al. | |
| 6,303,523 B1 | 10/2001 | Cheung et al. | |
| 6,503,557 B1 * | 1/2003 | Joret .......................... 427/167 |
| 6,670,543 B1 * | 12/2003 | Lohmeyer et al. .......... 136/258 |

* cited by examiner

*Primary Examiner*—Dung A. Le
(74) *Attorney, Agent, or Firm*—Dinsmore & Shohl LLP

(57) ABSTRACT

Systems and devices are disclosed utilizing a silicon-containing barrier layer. A semiconductor device is disclosed and includes a substrate, a gate oxide, a silicon-containing barrier layer and a gate electrode. The gate oxide is formed over the substrate. The silicon-containing barrier layer is formed over the gate oxide by causing silicon atoms of a precursor layer react with a reactive agent. The gate electrode is formed over the silicon-containing barrier layer.

4 Claims, 4 Drawing Sheets

SYSTEM AND DEVICE INCLUDING A BARRIER LAYER

CROSS REFERENCE TO RELATED APPLICATIONS

This application is a division of U.S. patent application Ser. No. 10/039,517, filed Jan. 3, 2002, U.S. Pat. No. 6,774,443, which is a division of U.S. patent application Ser. No. 09/653,639, filed Aug. 31, 2000, now U.S. Pat. No. 6,410,968. This application is also related to commonly assigned U.S. Pat. No. 6,576,964, METHOD FOR FORMING A DIELECTRIC LAYER TO INCREASE SEMICONDUCTOR DEVICE PERFORMANCE and U.S. Pat. No. 6,521,544, METHOD FOR FORMING A DIELECTRIC LAYER AT A LOW TEMPERATURE, the disclosures of which are incorporated herein by reference.

FIELD OF THE INVENTION

The present invention relates to the field of semiconductors and, more particularly, to an improved barrier layer for increasing semiconductor performance.

BACKGROUND OF THE INVENTION

There is a constant demand for semiconductor devices of a reduced size. The performance of semiconductor capacitors, transistors, electrode layers and the like in semiconductor devices becomes more critical as device size decreases. Accordingly, processes that result in increased device performance are critical to improved semiconductor device fabrication. For example, capacitor and transistor performance can be improved by limiting diffusion of oxygen to transistor active areas or capacitor electrodes.

Barrier layers are generally used in circuitry and semiconductor devices to enhance performance by reducing diffusion, migration and reaction. Accordingly, there is a continuing need for improved barrier layer technology directed at improving semiconductor device performance.

SUMMARY OF THE INVENTION

This need is met by the present invention wherein a method of forming a barrier layer on a semiconductor device is disclosed. According to one embodiment of the present invention, a semiconductor device is provided. A silicon-containing material is deposited on the semiconductor device. The silicon-containing material is processed in a reactive ambient.

According to another embodiment of the present invention, a semiconductor device is disclosed. The semiconductor device includes a substrate, a gate oxide, a silicon-containing barrier layer and a gate electrode. The gate oxide is formed over the substrate. The silicon-containing barrier layer is formed over the gate oxide. The gate electrode is formed over the silicon-containing barrier layer.

Other methods and devices are disclosed.

BRIEF DESCRIPTION OF THE SEVERAL VIEWS OF THE DRAWINGS

The following detailed description of the present invention can be best understood when read in conjunction with the accompanying drawings, where like structure is indicated with like reference numerals.

DETAILED DESCRIPTION OF THE INVENTION

Figure 1A:
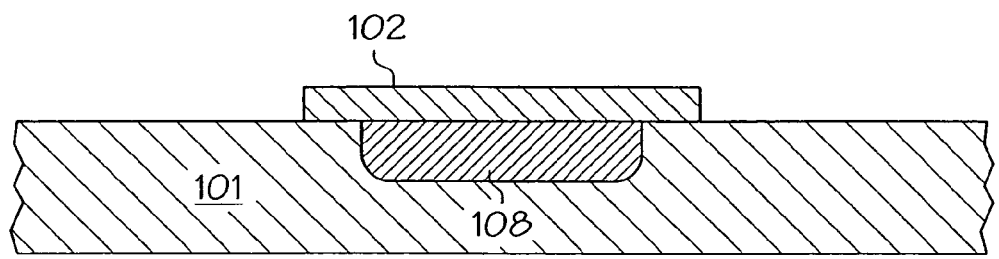
FIG. 1A illustrates a semiconductor device using a barrier layer according to one embodiment of the present invention.

FIG. 1A illustrates a semiconductor device 108 using a barrier layer 102 according to one embodiment of the present invention. The semiconductor device 108 is merely illustrated schematically in FIG. 1 and is typically fabricated proximate to a substrate 101. More specifically, the semiconductor device 108 may be formed in, on or over the substrate 101. For the purposes of defining and describing the present invention, it is noted that a semiconductor device 108 may comprise a transistor, capacitor, electrode, insulator or any of a variety of components commonly utilized in semiconductor structures. The substrate 101 may comprise one or more semiconductor layers or semiconductor structures which may define portions of the semiconductor device 108. The barrier layer 102 is formed over the semiconductor device 108. Generally, the barrier layer 102 is formed by depositing one or more precursor materials from a silane or silazane source and converting the deposited materials into the barrier layer 102 by subsequent processing of the deposited materials. The subsequent processing of the deposited materials involves subjecting the deposited materials to a reactive agent, such as an oxidizing or nitridizing species, which will react with silicon in the deposited materials. The barrier layer 102 reduces or prevents diffusion or migration of dopants into and out of the semiconductor device 108 and reaction or oxidation of the materials forming the semiconductor device 108.

Figure 1B:
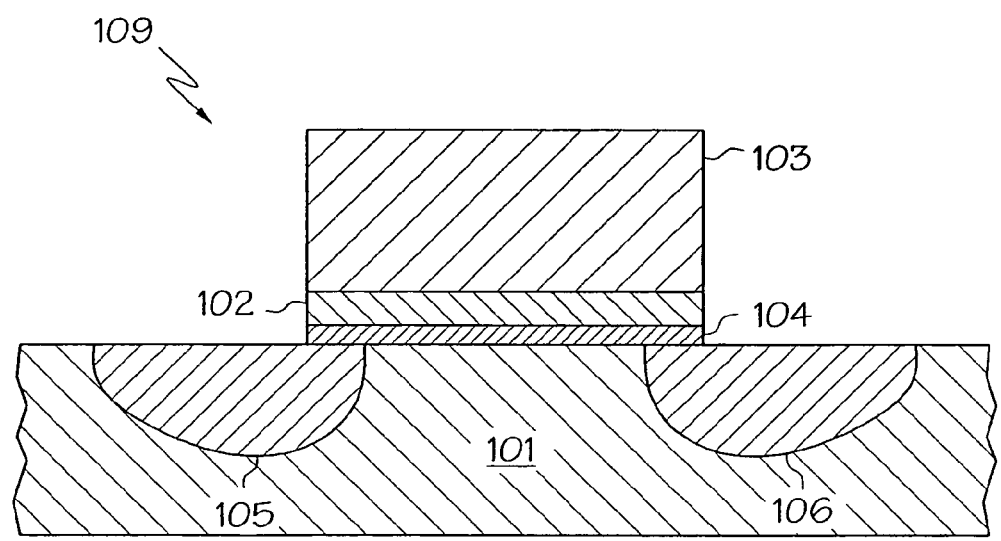
FIG. 1B illustrates a transistor semiconductor device utilizing a barrier layer according to one embodiment of the present invention.

FIG. 1B illustrates a transistor semiconductor device 109 utilizing a barrier layer 102 according to another embodiment of the present invention. A source 105 is formed in a substrate 101. A drain 106 is formed in the substrate 101. A gate oxide layer 104 is formed over the substrate 101 from the source 105 to the drain 106. A barrier layer 102 is formed over the gate oxide layer 104. An electrode or gate electrode 103 is formed over the barrier layer 102. The source 105, the drain 106, the substrate 101, the gate oxide layer 104 and the gate electrode 103 may be provided in accordance with convention techniques of semiconductor fabrication.

The barrier layer 102 is fabricated by vapor depositing one or more selected materials or precursors from a silicon source and subsequently processing those materials or precursors. The silicon source may be a silazane or a silane source such as hexamethyldisilazane (HMDS). Other silicon sources which may be used are tetramethyldisilazane, octamethylcyclotetrasilazine, hexamethylcyclotrisilazine, diethylaminotrimethylsilane or dimethylaminotrimethylsilane. The selected material is processed in a reactive ambient to create a final desirable silicon-containing barrier layer. Reactive ambients include oxygenating or nitridating species which will react with silicon to form the silicon-containing barrier layer. Some reactive ambients are $NH_3$, $N_2$, $O_2$, $O_3$, NO and the like. The resulting silicon-containing barrier layer is the barrier layer 102 and may comprise a layer that is primarily nitride, primarily oxide or an oxynitride depending on the reactive ambient selected. The silicon-containing barrier layer contains no metal.

The barrier layer 102 prevents dopants, such as boron, in the gate electrode 103 from diffusing into the gate oxide layer 104, the source 105 and the drain 106. The barrier layer 102 also prevents reactions between the gate electrode 103 and the gate oxide layer 104, prevents migration of dopants from the gate electrode 103 to other areas of the semiconductor device, prevents oxidation of the gate electrode 103 and prevents the formation of silicides on the gate electrode.

Figure 2A:
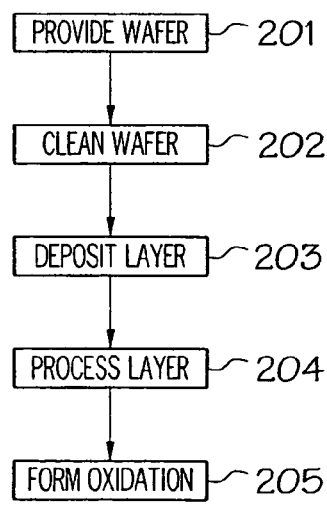
FIG. 2A is a flowchart of a method for fabricating a barrier layer according to another embodiment of the present invention.

FIG. 2A illustrates a method for fabricating a barrier layer according to one embodiment of the present invention. A wafer or substrate is provided at block 201. The wafer or substrate is cleaned using hydrofluoric acid (HF) at block 202. A silicon-containing material is vapor deposited onto the surface of the wafer at block 203 from a silicon source. The silicon-containing material is treated or processed using rapid thermal nitridation (RTN) in an $NH_3$ ambient at block 204 resulting in creation of the barrier layer. The temperature, anneal time and processing pressure are selected to obtain desired barrier layer characteristics. A wet oxidation layer is formed over the barrier layer at block 205.

Figure 2B:
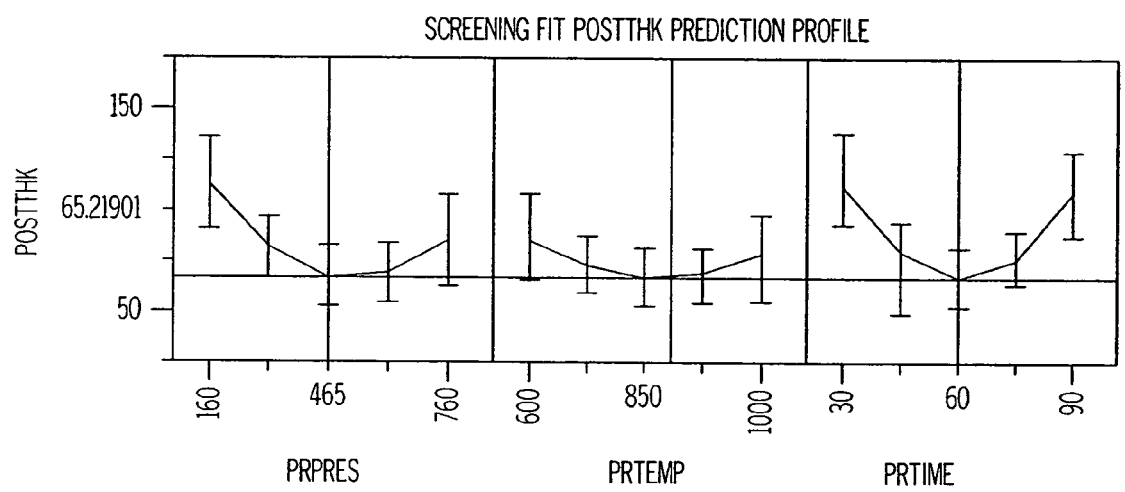
FIG. 2B illustrates exemplary thickness measurements of the barrier layer using the method of FIG. 2A.

FIG. 2B illustrates thickness measurements of the barrier layer and wet oxidation layer created using the method of FIG. 2A using various processing conditions. In this figure, the wet oxidation has a thickness of 300 Å. For this particular example, FIG. 2B illustrates that a suitable barrier layer may be formed at about 450 Torr and 850° C., over a processing time of 60 seconds with minimal oxidation of the underlying silicon substrate. It is noted that the 850° C. processing temperature is lower than the processing temperature (typically 950° C.) used to create barrier layers using conventional methods. In addition, the 60 seconds processing time is lower that the processing time used to create barrier layers using conventional methods (typically 45 minutes).

However, the processing time can be longer without a detrimental affect if silane or silazane silicon sources are used because they are self limiting.

Generally, conventional barrier layers are processed using temperature ranges of 700° C. to 1050° C., processing time of 10 seconds to 60 minutes, and processing pressure of 760 torr. Whereas, the barrier layer of the present invention is typically processed using temperature ranges of 500° C. to 850° C., processing time of 30 seconds to 5 minutes, and processing pressure of 450 torr. It is contemplated that variations to these ranges may also result in suitable barrier layer formation.

Figure 3:
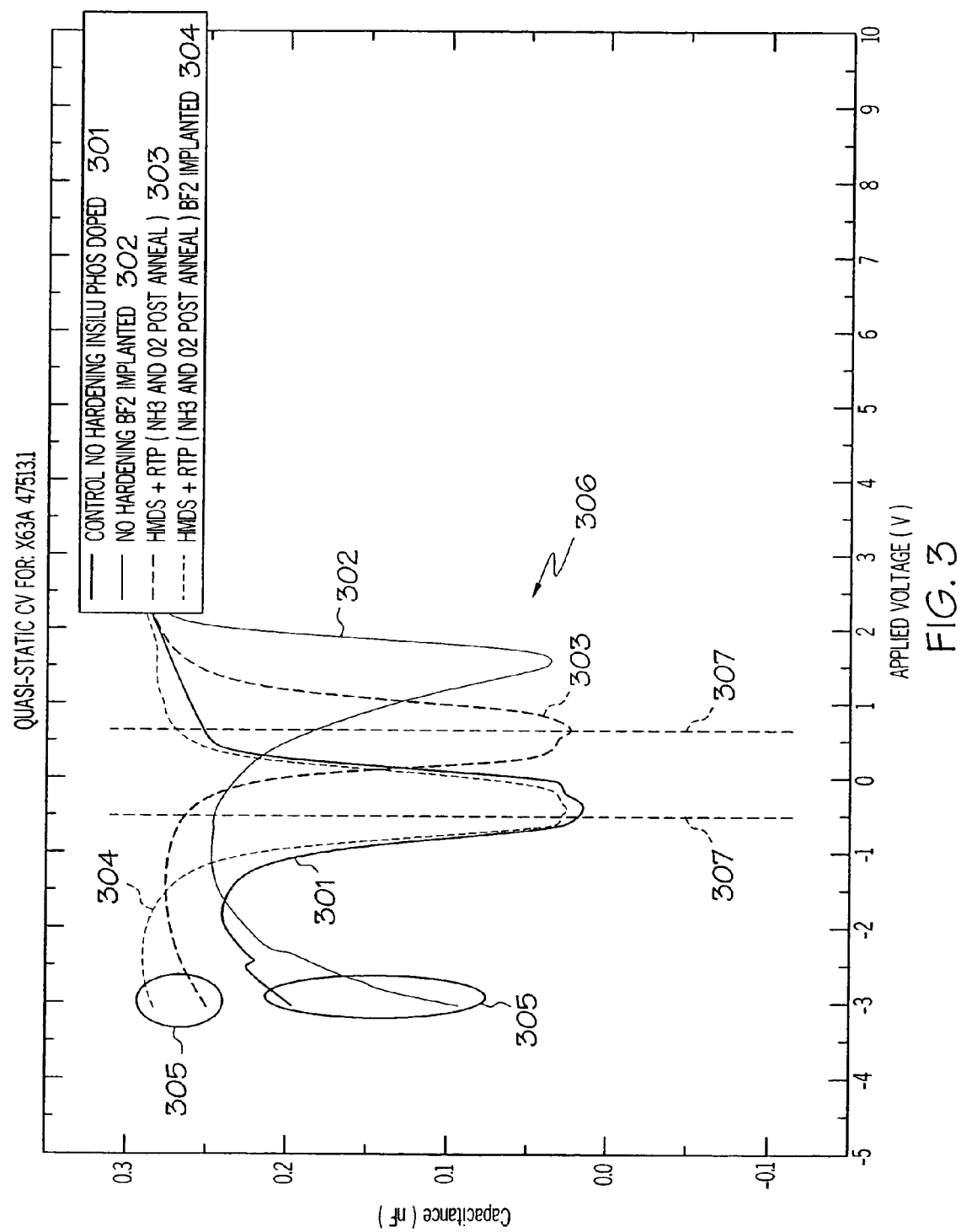
FIG. 3 illustrates capacitance characteristics of a semiconductor device utilizing a barrier layer according to another embodiment of the present invention.

Referring to FIGS. 1B and 3, FIG. 3 illustrates the capacitance characteristics of a semiconductor device 109 utilizing a barrier layer 102 according to the present invention. The capacitance characteristics of a device with a conventional barrier layer with a N+ $PH_3$ doped polysilicon gate electrode are illustrated at 301. Line 302 illustrates the capacitance characteristics of a device with a conventional barrier layer and a $BF_2$ doped polysilicon gate electrode. Line 303 shows the capacitance characteristics of a barrier layer 102 created by vapor depositing HMDS with a N+ $PH_3$ doped polysilicon gate electrode 103. Line 304 shows the capacitance characteristics of a device with a barrier layer 102 created by vapor depositing HMDS with a $BF_2$ doped polysilicon gate electrode. Comparing the capacitance values of lines 301 and 302 with lines 303 and 304, it is noted that negative bias capacitance is enhanced by the present invention. The barrier layers used in lines 303 and 304 were processed using $NH_3$ and $O_2$.

In addition, line 302 shows how the conventional barrier layer suffers boron diffusion into the gate and active areas (note the shift in threshold voltage at 306). Line 307 shows that the measured work function, associated with the vapor deposited HMDS barrier layers of lines 303 and 304 match theoretical values.

Figure 4:
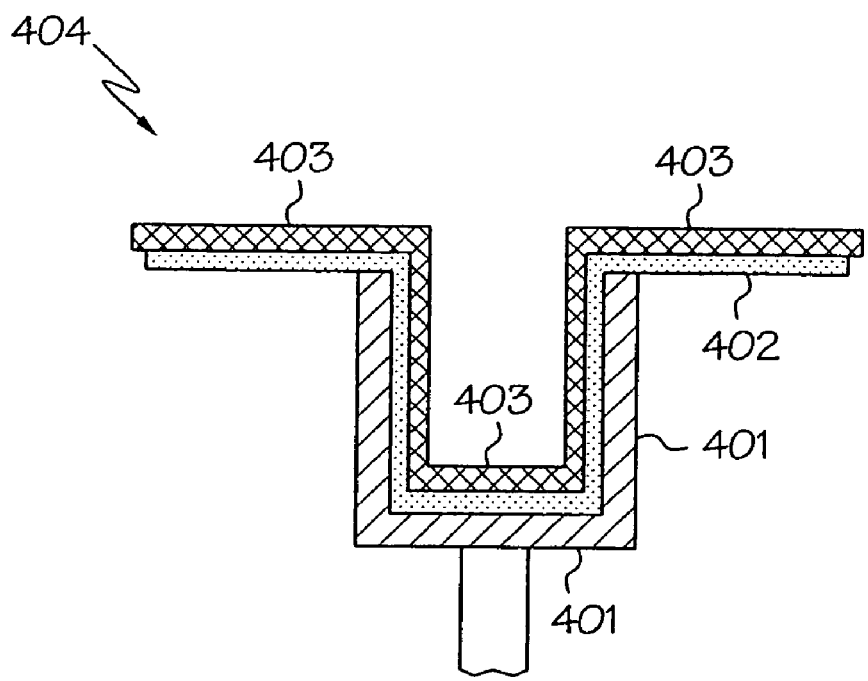
FIG. 4 illustrates a barrier layer according to another embodiment of the present invention.

FIG. 4 illustrates use of a barrier layer 402 according to another embodiment of the present invention. The barrier layer 402 is located between a dielectric 403 and a electrode 401. The barrier layer 402 is created by depositing a silicon-containing material (from silazane or silane type silicon sources). The layer is then post-processed in a reactive ambient. The dielectric 403 is of a material susceptible to oxygen migration such as $Ta_2O_5$. The electrode is of a material such as P—Si, SiGe, a metal, or any other electrode material suitable for use in semiconductor based charge storage devices.

Figure 5:
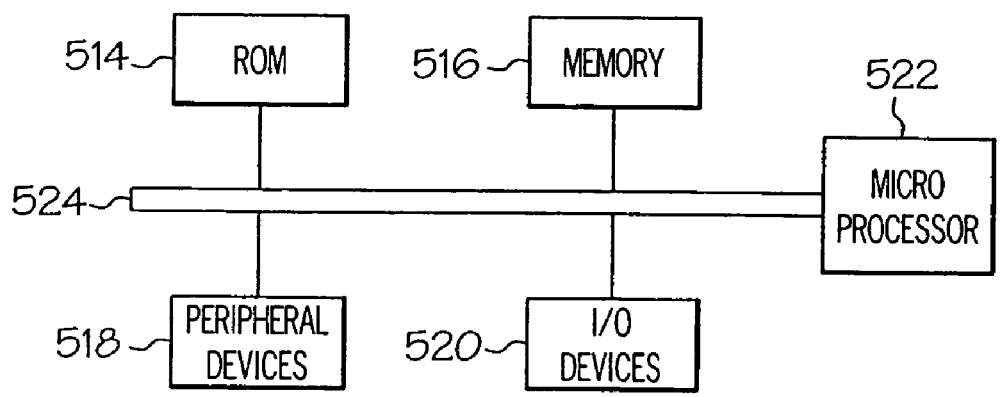
FIG. 5 is an illustration of a computer system for use with embodiments of the present invention.

FIG. 5 is an illustration of a computer system that can use and be used with embodiments of the present invention. As will be appreciated by those skilled in the art, the computer system would include ROM 514, mass memory 516, peripheral devices 518, and I/O devices 520 in communication with a microprocessor 522 via a data bus 524 or another suitable data communication path. The mass memory 516 can include silicon-containing barrier layers in, for example, transistor structures or charge storage structures. The mass memory 516 may further include a substrate, a drain, a source rail, and an oxide layer. Generally, the drain and source rail are formed in the substrate. The oxide layer is typically deposited over the substrate and stretches from the drain to the source rail. The silicon-containing barrier is generally deposited over the first oxide layer. These devices can be fabricated according to the various embodiments of the present invention.

For the purposes of describing and defining the present invention, formation of a material "on" a substrate or layer refers to formation in contact with a surface of the substrate or layer. "Formation over" a substrate or layer refers to formation either above or in contact with a surface of the substrate.

As stated earlier, barrier layers fabricated using the present invention can be used for a variety of purposes. Some examples follow, but embodiments of the present invention are not limited to these. A barrier layer can be formed on top of metals to prevent oxidation of metals. A barrier layer can be placed between metals and silicon containing materials to prevent agglomeration, the formation of silicides. A barrier layer can be used in a P+ or N+ gate to prevent dopant, hydrogen, or flourine in-diffusion into the gate dielectric reducing defect density and increasing performance and reliability. A barrier layer can be used in post gate stack and pre oxidation steps to prevent oxygen in-diffusion into active areas of the transistor.

A barrier layer can be used to prevent oxidation of gate electrodes with subsequent processing steps when using materials such as polysilicon, Si—Ge, W or other transistion metals. A barrier layer can be used with a storage dielectric, such as non-volatile random access memory, and may be used to reduce degradation of tunnel oxide performance.

Having described the present invention in detail and by reference to preferred embodiments thereof, it will be apparent that modifications and variations are possible without departing from the scope of the present invention defined in the appended claims.

What is claimed is:

1. A semiconductor device having a precursor layer comprising:
    a silicon substrate including at least one semiconductor layer;
    a first semiconductor device fabricated proximate to said substrate; and
    a metal-free silicon-containing precursor layer formed over at least a portion of said first semiconductor device; wherein said silicon-containing precursor layer comprises a silane.

2. A semiconductor device having a precursor layer comprising:
    a silicon substrate including at least one semiconductor layer;
    a first semiconductor device fabricated proximate to said substrate; and
    a metal-free silicon-containing precursor layer formed over at least a portion of said first semiconductor device; wherein the silicon-containing precursor layer comprises a silazane.

3. A semiconductor device having a precursor layer comprising:
    a silicon substrate including at least one semiconductor layer;
    a first semiconductor device fabricated proximate to said substrate; and
    a metal-free silicon-containing precursor layer formed over at least a portion of said first semiconductor device; wherein the silicon-containing precursor layer is selected from the group comprising hexamethyldisilazane, tetramethyldisilazane, octamethylcyclotetrasilazine, hexamethylcyclotrisilazine, diethylaminotrimethylsilane and dimethylaminotrimethylsilane.

4. A semiconductor device having a precursor layer comprising:
    a silicon substrate including at least one semiconductor layer; and
    a precursor layer comprising a metal-free silicon-containing material from a silazane source formed over at least a portion of said at least one semiconductor layer.

* * * * *